United States Patent [19]
Desautels

[11] Patent Number: 4,719,416
[45] Date of Patent: Jan. 12, 1988

[54] METHOD FOR DETERMINING THE MINIMUM NUMBER OF ACQUISITION SWEEPS TO MEET THE RISETIME SPECIFICATIONS OF A DIGITAL OSCILLOSCOPE

[75] Inventor: Patricia A. Desautels, Colorado Springs, Colo.

[73] Assignee: Hewlett Packard Company, Palo Alto, Calif.

[21] Appl. No.: 929,551

[22] Filed: Nov. 10, 1986

[51] Int. Cl.⁴ ............................................. G01R 13/20
[52] U.S. Cl. ................................ 324/121 R; 364/487; 364/580
[58] Field of Search .......................... 324/121 R, 77 A; 364/487, 579, 580; 340/347 SH; 315/367; 328/150, 151

[56] References Cited

U.S. PATENT DOCUMENTS

| | | | |
|---|---|---|---|
| 4,104,725 | 8/1978 | Rose et al. | 364/580 |
| 4,142,146 | 2/1979 | Schumann et al. | 324/77 A |
| 4,495,586 | 1/1985 | Andrews | 364/487 |
| 4,694,244 | 9/1987 | Whiteside et al. | 324/121 R |

Primary Examiner—Ernest F. Karlsen
Attorney, Agent, or Firm—Christopher J. Byrne; Jon R. Stark

[57] ABSTRACT

Disclosed is a method for determining and executing the minimum number of sample acquisition-sweeps necessary to meet the risetime specifications of a digital oscilloscope which uses random repetitive sampling. The method of the present invention selects from two criteria to determine the required number of acquisition sweeps. At narrow time ranges a risetime criterion is used. At wider time ranges a percentage-filled criterion is used. The choice between criteria depends upon the user-selected time range setting. The time range setting directly affects the time-width of each one of a fixed number of time-buckets. A time-bucket is a discrete unit of time which varies directly with the time-width of the user-selected time range. The number of time-buckets is fixed. Time-buckets can be manifested either on the oscilloscope display screen or in the oscilloscope's memory. At time range settings where the time-width of each time-bucket is less than or equal to one-half of the risetime of the oscilloscope, the risetime criterion applies and ensures, prior to display of a waveform, that there is at least one sample point for each risetime-unit of time throughout all the time-buckets. At time range settings where the width of each time-bucket is greater than one-half of the risetime of the oscilloscope, the percentage-filled criterion applies and ensures, prior to display of a waveform, that a certain percentage of the time-buckets have been filled with sample point data. The minimum number of acquisition-sweeps necessary, using either the risetime or the percentage-filled criterion, is determined using a binomial probability formula.

3 Claims, 8 Drawing Figures

METHOD FOR DETERMINING THE MINIMUM NUMBER OF ACQUISITION SWEEPS TO MEET THE RISETIME SPECIFICATIONS OF A DIGITAL OSCILLOSCOPE

BACKGROUND OF THE INVENTION

An oscilloscope is used to acquire, analyze and display electronic signal waveforms. The oscilloscope samples electronic signals and plots their waveforms on a cathode ray tube (CRT) display screen in units of voltage versus time. Conventionally, voltage amplitude is plotted along the vertical, that is, the Y-axis, and time is plotted along the horizontal, that is, the X-axis. In the past decade, digital oscilloscopes have been developed. The basic scheme in digital oscilloscope operation is the sampling of a signal, followed by analog-to-digital conversion of the voltage values of the acquired samples. The digitized information is then placed in memory and used to create the display of the signal's waveform. Overall, two chief concerns are the speed and the precision with which the oscilloscope acquires and ultimately displays a signal waveform. The optimal situation is obtained where maximum precision is achieved in a minimum amount of time.

The precision of a digital oscilloscope is often expressed in terms of its risetime. Risetime is analytically defined as follows: risetime=0.35/bandwidth, where bandwidth is the range of signal frequencies, commonly beginning at dc, which the oscilloscope can acquire. Risetime is equivalently defined as the amount of time required for a voltage signal to rise from ten percent to ninety percent of its final voltage amplitude. Hence, the risetime of an oscilloscope is the risetime of the highest frequency signal that the oscilloscope can acquire. The fastest risetime oscilloscopes are the most precise.

The overall speed of a digital oscilloscope is a function of the speed of acquisition and display routines which the oscilloscope must execute in order to acquire and display a signal waveform. Faster execution of acquisition and display routines will minimize oscilloscope "deadtime", that is, the time spent waiting for routines to complete. During deadtime, data may be missed. Therefore, minimizing sample acquisition and display times will maximize overall speed.

A digital oscilloscope acquires a signal by sampling it. A signal is sampled in cycles known as acquisition-sweeps. A sweep occurs whenever the signal crosses a threshold level, known as a trigger. Given the trigger, acquisition-sweep occurs as a function of a sample clock, such as a 25 MHz crystal oscillator. Samples of the signal are acquired on the rising edge of the sample clock, that is, every 40 nanoseconds, for a 25 MHz clock. The number of samples acquired per acquisition-sweep is the value of the user-selected time-range divided by the period of the sample clock. The time-range is the width, measured in units of time, of the display screen window. For instance, the time width of the display screen may be a factor of nanoseconds(ns), microseconds(us), milliseconds(ms), and so on up to some maximum time-range setting. Thus, with a 40 ns sample clock period and a time-range setting of 200 ns, the number of samples per sweep would be 200/40=5 samples/sweep. In addition, the display screen window can be partitioned into a fixed number of discrete time units called time-buckets. The time width of each time-bucket varies directly with time-range. The time-buckets are mapped into a waveform buffer in memory. Each time-bucket, whether in memory or on the screen, holds a single sample point.

Generally, two types of sampling techniques are used in digital oscilloscopes: single-shot and repetitive sampling. With single-shot sampling, also known as real-time sampling, the signal waveform is acquired on only one acquisition sweep but many points on the waveform are sampled. Once it is acquired, the waveform is displayed. With repetitive sampling, on the other hand, the signal waveform is acquired on repetitive acquisition sweeps and typically fewer points are sampled per sweep. The advantage of single-shot sampling is that non-periodic, "one-time event" signals can be acquired. The advantage of repetitive sampling is that high frequency periodic signals can be acquired.

A repetitive sampling technique known as random repetitive sampling allows for the capture of higher frequency periodic signals than the sampling rate would otherwise permit, while providing pre-trigger information. In random repetitive sampling, when the input signal crosses a triggering threshold level, a precise measurement is made of the time between the trigger and the time of the next sample, that is, the beginning of the next period of the sample clock. This measurement is used to assign each sample a time coordinate relative to the trigger. This method of sampling is random because there is no correlation between the time of the sample and the time of the trigger signal, that is, the two events are asynchronous. This randomness allows for the capture of a higher frequency signal than the rate of the sample clock would otherwise allow. This method of sampling is repetitive because the process is repeated at narrow time-range settings until enough points have been collected to accurately reconstruct the waveform for display. This repetitiveness allows for the capture of very high frequency signals.

With very fast risetime oscilloscopes which employ random repetitive sampling, overall instrument speed is decreased, that is, deadtime is increased, through iterative executions of sample acquisition-sweep routines and waveform-display routines, particularly if the display routines execute following individual acquisition-sweeps. As a way of minimizing deadtime, display routines may be postponed until a certain percentage of the time-buckets for a given time-range setting are filled with sample-point data. For instance, given 1000 time-buckets, display may occur whenever eighty-five percent, that is, 850, of the time-buckets have been filled. Using the proper percentage, however, is crucial. For example, in the wider time-ranges, signal frequencies well within the instrument's bandwidth may be inaccurately reconstructed for display if the percentage is too low and thus insufficient points are collected. On the other hand, in the more narrow, faster, time-ranges, if the percentage is too high then more than enough points to reconstruct the waveform may be collected thus delaying display during collection of the extra points.

SUMMARY OF THE INVENTION

The present invention provides a method for determining and executing the minimum number of sample acquisition-sweeps necessary to meet the risetime specifications of a digital oscilloscope which uses random repetitive sampling. Therefore, unnecessary acquisition sweeps are not executed and time consuming display routines are executed only once, after the minimum number of acquisition-sweeps has occurred. Hence, the risetime specification of the digital oscilloscope is met in the shortest amount of time possible.

The method of the invention selects from two criteria to determine the required number of acquisition sweeps, one for narrow time-ranges when the risetime specification is the determinative factor, and another for wider time-ranges, when the risetime specification is inapplicable. At narrow time-ranges, a so-called risetime criterion is employed. At wider time-ranges a so-called percentage-filled criterion is employed. The minimum number of acquisition sweeps necessary, using either the risetime or the percentage-filled criterion, is determined using a binomial probability formula applied to the variables and relationships which characterize digital oscilloscope operation. At time-ranges where the time-width of each time-bucket is less than or equal to one-half of the risetime of the oscilloscope, the present invention calculates the minimum number of acquisition-sweeps necessary to acquire at least one sample point for each one-half-risetime unit of time. This requirement ensures, with statistical reliability, that whenever possible, the risetime specification is met with a minimum number of acquisition-sweeps. Sample point data is displayed only after this number of acquisition-sweeps has been executed, thus reducing the number of acquisition and display routine cycles to a minimum. For the wider time-range settings where each time-bucket is wider than one-half-risetime unit of time, a percentage-filled criterion is used such that the acquired sample points are not displayed until a certain percentage of the time-buckets have been filled, such as eighty-five percent. This percentage-filled criterion is also met with a minimum number of acquisition-sweeps. In the preferred embodiment, the minimum number of acquisition-sweeps necessary for any given time-range setting of a particular oscilloscope is calculated and stored in a look-up table. When the user selects a time-range setting, the instrument automatically determines the appropriate minimum number of acquisition sweeps from the table, executes them, and the waveform is then displayed.

DESCRIPTION OF THE PREFERRED EMBODIMENT

Figure 1:
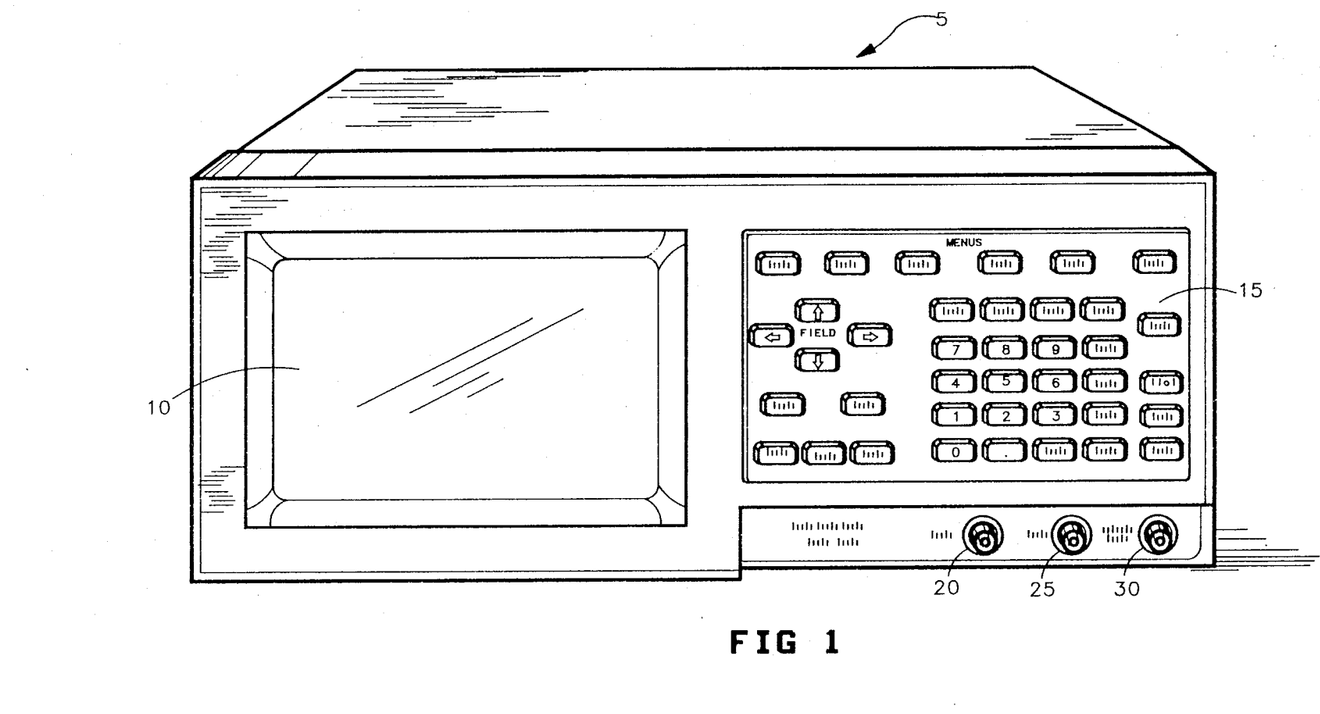
FIG. 1 shows a general overview of a digital oscilloscope.

FIG. 1 is a general overview of a digital oscilloscope 5 such as would incorporate the present invention. Oscilloscope 5 is operated and controlled by the user with menu keyboard 15. Trigger signals for reference and input signals for display are received at ports 20, 25, and 30. Input signal waveforms are viewed on display screen 10.

Figure 2:
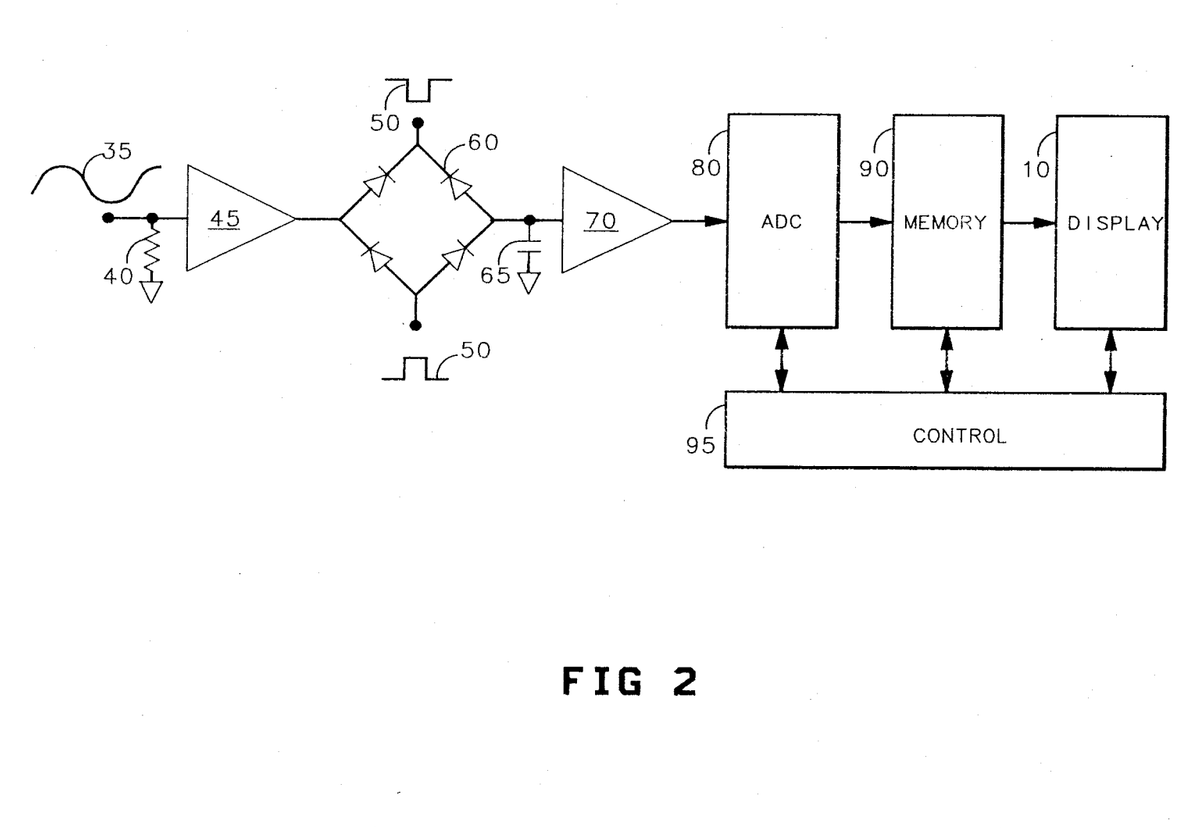
FIG. 2 shows a functional diagram of the digital oscilloscope of FIG. 1.

FIG. 2 is a functional overview of digital oscilloscope 5. Sensing circuit 40 detects input signal 35. Signal 35 is buffered by pre-amp 45 and applied to sampling bridge 60. Clock pulse 50 drives sampling bridge 60 in such a way that a sample of the input signal is passed on to holding cricuit 65 with each period of sampling clock 50. Post-amp 70 then delivers the voltage values from holding circuit 65 to analog-to-digital converter 80 (ADC). ADC 80 converts the sample voltage values to digital words such that each signal sample is represented by a single digital word. The digitized samples produced by ADC 80 are stored in memory structure 90. This digital information is then used to create a display on display screen 10 of the waveform of signal 35. Control circuitry 95 governs the interaction of ADC 80, memory 90 and display screen 10.

Figure 3:
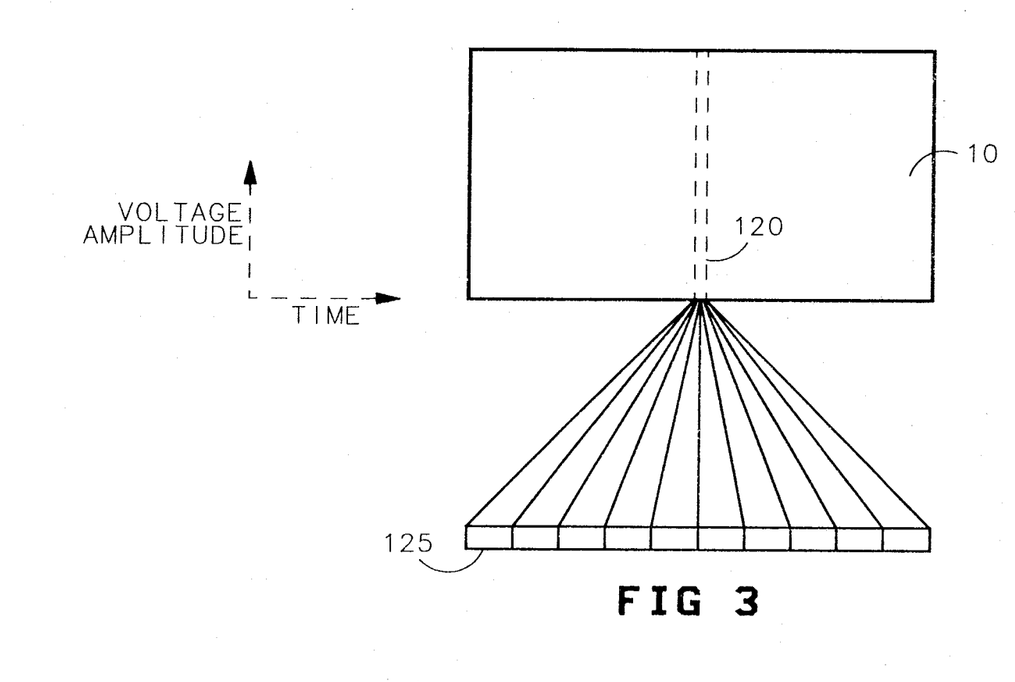
FIG. 3 is a schematic depiction of how display screen 10 of FIGS. 1 and 2 is divided into discrete time-buckets.

FIG. 3 is a schematic depiction of how display screen 10 of FIGS. 1 and 2 is divided into discrete units of time called time-buckets. Display screen 10 may be viewed as a two-dimensional structure having voltage amplitude measured along its vertical axis and time measured along its horizontal axis. Segment 120 of display screen 10 shows that the time axis is resolvable into numerous discrete equal units of time, such as discrete unit 125. In the preferred embodiment of the present invention, there are 1000 discrete units for the entire display screen 10 and each discrete unit is referred to as a time-bucket, such as time-bucket 125. Each time-bucket is also manifested in memory, as explained below. In the preferred embodiment of the present invention, the number of time-buckets, both in memory and on the display screen, is fixed. However, the total time-width of display screen 10 may vary. The time-width of the display screen 10 is referred to as the time-range. In the preferred embodiment, the available time-range selections are 10ns, 20ns, 50ns, 100ns, 200ns, 500ns, 1us, 2us, 5us, 10us, 20us, 50us, and so on up to a maximum time-range setting. This 1-2-5 sequence of time-range settings follows industry convention. Hence, the time-width of an individual time-bucket for any given time-range setting will be the time-range setting divided by the number of time-buckets.

Figure 4:
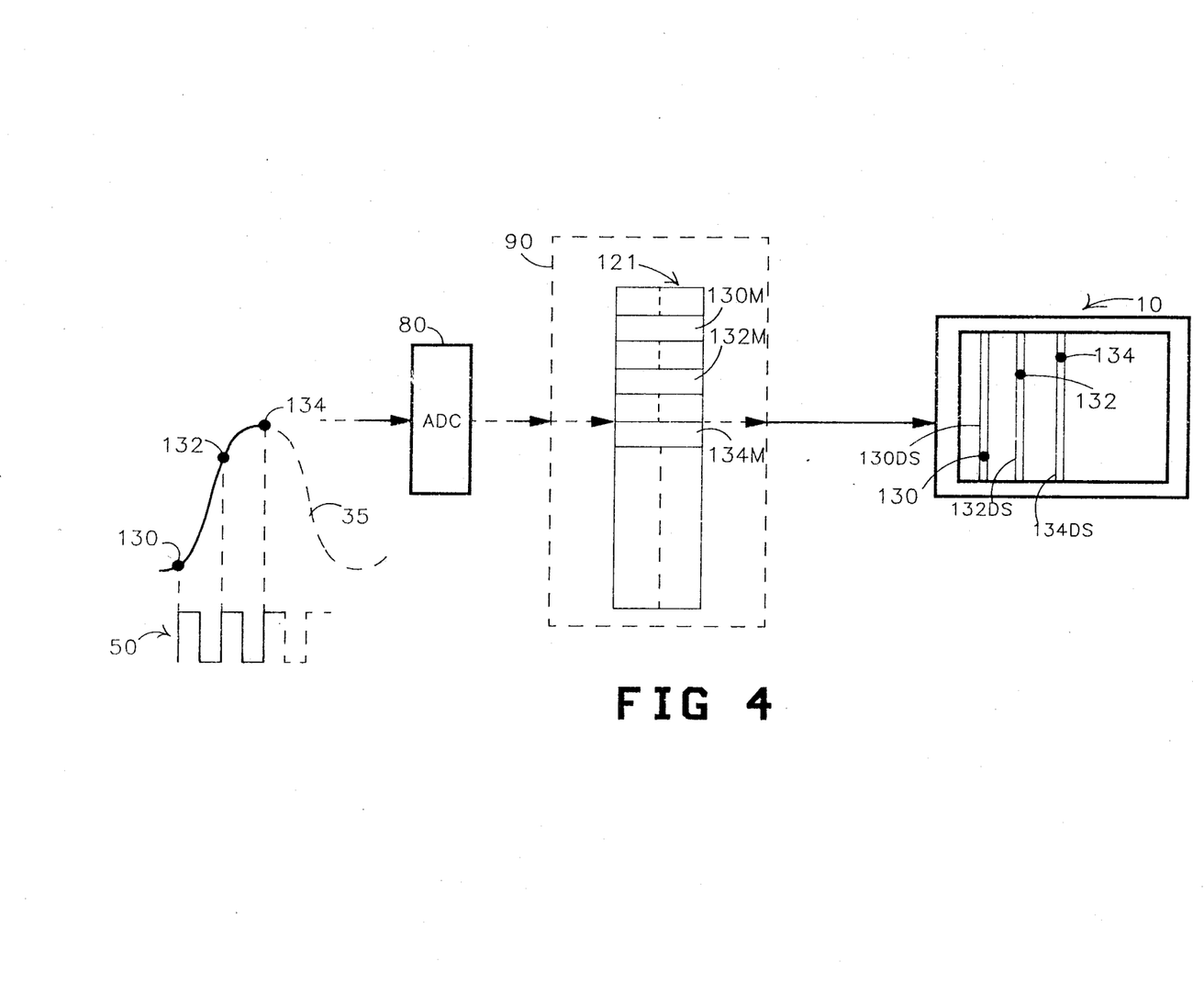
FIG. 4 shows the sampling of an input signal and the storage and display in time-buckets of the digitized sample information.

Figure 4 shows the sampling of an input signal 35 and the storage and display in time-buckets of the digitized information. Input signal 35 is sampled on the leading edge of each pulse of sample clock 50. Typical sample points 130, 132, and 134 are digitized by ADC 80 and stored, at equally spaced intervals, in waveform buffer 121 in time-buckets 130M, 132M and 134M, respectively. Time buckets 130M, 132M and 134M are implemented as digital words in waveform buffer 121. The sample point data is then mapped from waveform buffer 121 time-buckets 130M, 132M, and 134M to display screen 10 time-buckets 130DS, 132DS and 134DS, respectively.

Figure 4A:
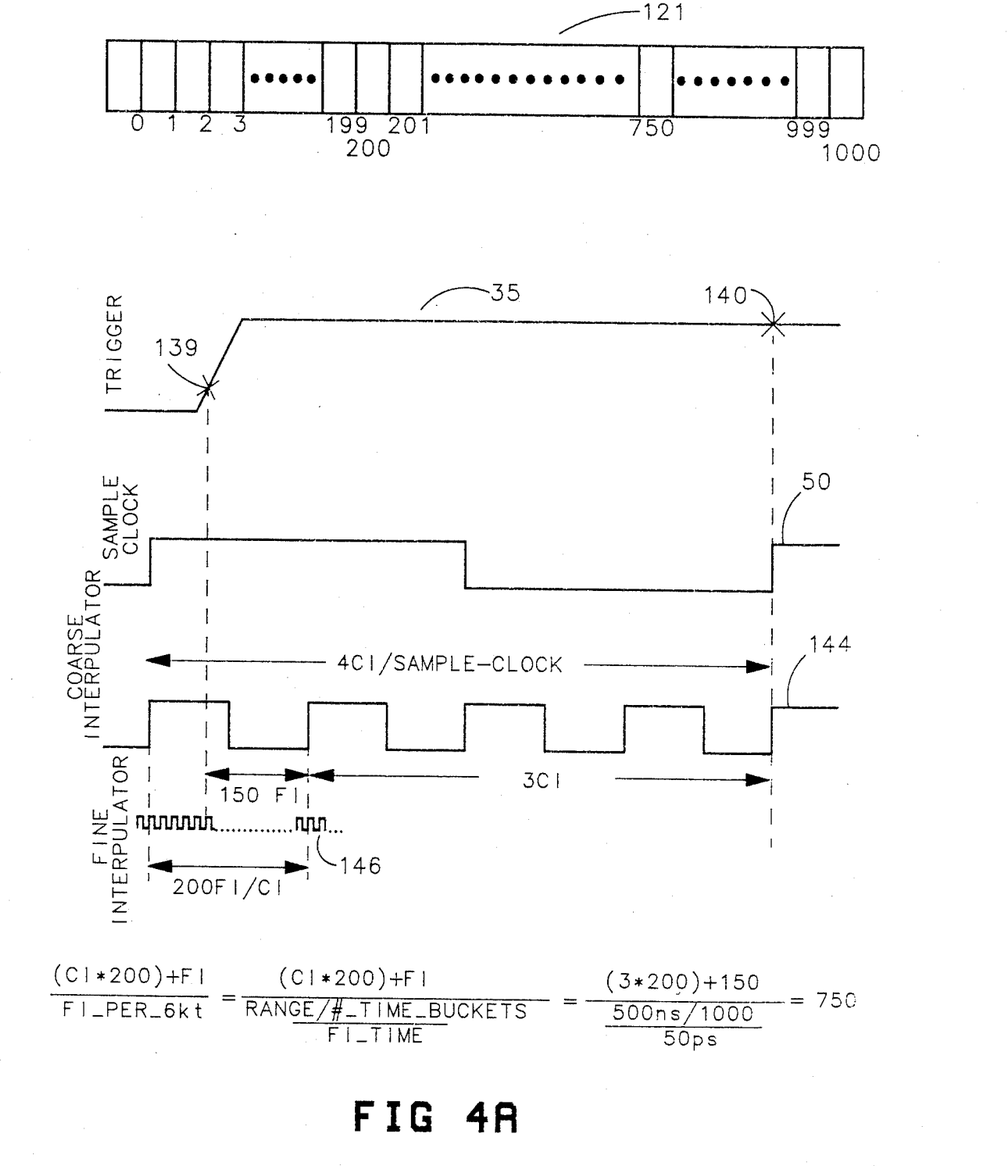
FIG. 4A shows how sample points are assigned addresses for proper ordinal positioning in memory time-buckets.

FIG. 4A shows how sample points are assigned addresses and positioned in the time-buckets of waveform buffer 121. Once a predetermined input signal trigger threshold 139 is crossed, sample point 140 of input signal 35 can be acquired on the rising edge of sample clock 50. A sample of the input signal is acquired once each period of the sample clock. In the preferred embodiment of the present invention, sample clock 50 has a 40ns period. In addition, two other higher frequency clocks, coarse interpolator (CI) 144 and fine interpolator (FI) 146, are synchronized with sample clock 50 and used to determine the ordinal positioning of acquired sample points in the time-buckets of waveform buffer 121. In the preferred embodiment of the present invention, coarse interpolator (CI) 144 has a 10ns period and fine interpolator (FI) 146 has a 50 picosecond (ps) period. Hence, there are four cycles of CI 144 for each cycle of sample clock 50 and two-hundred cycles of FI 146 for each cycle of CI 144. Given that there are 1000 time-buckets in waveform buffer 121, a single sample point must be assigned to one of 1000 addresses in waveform buffer 121. This assignment of addresses is performed using CI 144 and FI 146. Once trigger threshold 139 is crossed, the number of complete cycles of FI 146 between threshold crossing 139 and the first rising edge of CI 144 is counted. The index into waveform buffer 121 of the appropriate time-bucket for sample point 140 is defined as follows:

INDEX=((CI*200)+FI)/FI_PER_bkt where CI=the number of CI 144 cycles, FI=the number of FI 146 cycles, and FI_PER_bkt=(RANGE/#_of_time_buckets)/FI_time. RANGE is the range setting as selected by the user. FI_time and #_of_time_buckets are constants. In the preferred embodiment of the present invention, #_of_time_buckets=1000 and FI_time=50 ps.

Figure 5:
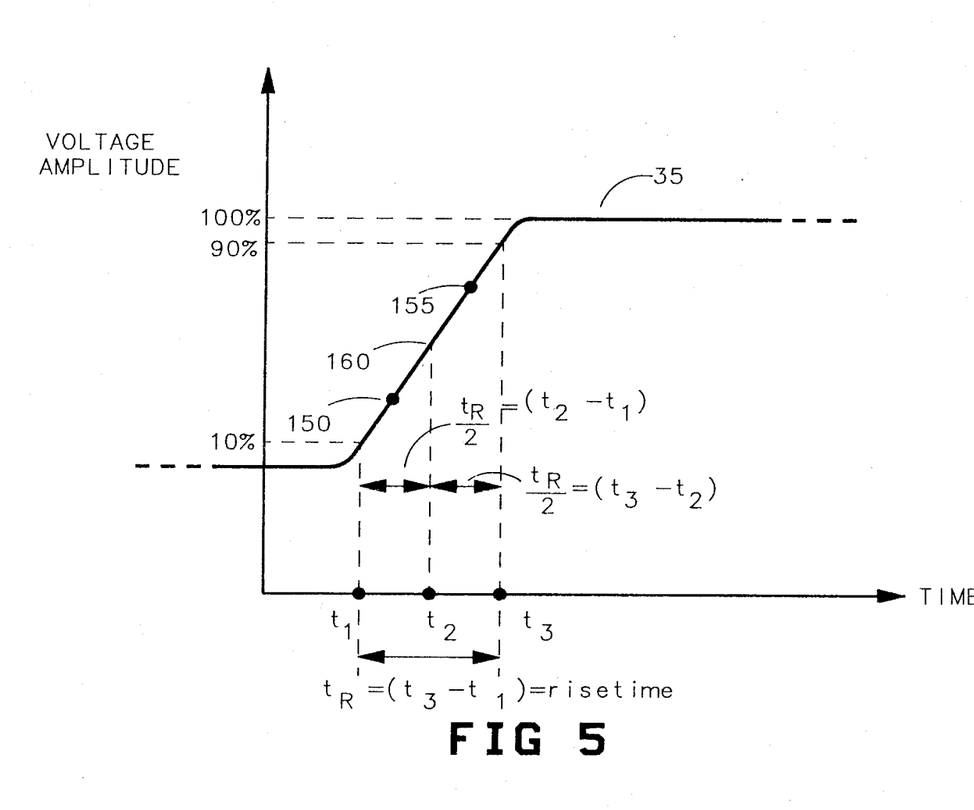
FIG. 5 shows the risetime of an input signal to a digital oscilloscope.

FIG. 5 shows an expanded view of a typical input signal 35. The risetime of signal 35 may be defined as the amount of time required for a signal to rise from ten percent to ninety percent of its final voltage amplitude. In FIG. 5, risetime $t_R$ is defined as follows: $t_R=(t_3-t_1)$. Likewise, one-half risetime $t_R$ is defined as follows: $t_R/2=(t_3-t_1)/2=(t_2-t_1)=(t_3-t_2)$. Likewise, the risetime specification of an oscilloscope is the risetime $t_R$ of the highest frequency signal which the oscilloscope may acquire.

FIG. 5 also illustrates the importance of the time-axis spacing of sample points for accurate reconstruction from samples of input signal 35. The risetime of input signal 35 can be determined from sample points 150 and 155. As can be seen from FIG. 5, line segment 160 connecting sample points 150 and 155 is an accurate reproduction of the actual risetime slope of input signal 35.

Commensurate with the slope illustrated by FIG. 5, the the present invention ensures, with a statistically reliable degree of certainty, that at time-range settings at which the time width of the time-buckets is less than or equal to one-half of the risetime of the instrument, that there exists at least one sample point for each one-half-risetime unit of time before the contents of the time-buckets in memory are displayed. This requirement essentially guarantees that there will be two sample points for each risetime unit of time such that the risetime specification of the instrument is always met at these time-range settings. Moreover, the present invention ensures, with a statistically reliable degree of certainty, that only a minimal number of aquisition-sweep necessary to meet this risetime criterion is executed, thus reducing acquisition time to a minimum. On the other hand, at time-range settings where the time-width of each time-bucket is greater than one-half of the risetime of the instrument, the present invention ensures, with a statistically reliable degree of certainty, that 100 percent of the time-buckets have been filled with sample point data before the display routine is invoked. As with the risetime criterion, the percentage-filled criterion is met with a minimum number of acquisition-sweeps. This percentage-filled criterion cannot guarantee that the risetime will be met as rigorously as in FIG. 5, but it does ensure that enough points will be acquired to produce an accurate display at the wider time-ranges.

At the heart of the present invention is the notion that sampling techniques exhibit probabilistic behavior. This behavior can be predicted with well known probability mathematics. As noted in the background section of the specification, signals are sampled in acquisition sweeps. Each sweep implies that the signal has crossed a threshold level, known as a trigger. In single-shot sampling, the signal's waveform is acquired in one acquisition-sweep, typically with many sample points acquired per sweep. In repetitive sampling, multiple acquisition sweeps are required. On each sweep, samples of the waveform are acquired and their relationship to the trigger point is determined. The waveform is reconstructed for display by putting all the sample points together while maintaining their timing relationships. In random repetitive sampling, the time between the trigger and the taking of a sample is random, that is, the two events are asynchronous, and this time interval is measured in order to preserve the proper timing relationships between samples when reconstructing the waveform for display.

In analyzing the probabilistic behavior of sampling techniques, the relevant probability formula is known as the probability mass function of a binomial random variable:

$$P_r = \sum_{i=1}^{n} (n!/[i!(n-i)!])p^i(1-p)^{(n-i)}, \quad (1)$$

where $P_r$ is the probability of obtaining at least "r" successes in "n" trials with each trial having a success-probability of "p" and a failure probability of $(1-p)$. See *Probability With Applications*, Michael Woodroofe, McGraw-Hill, 1975. In terms of the present invention, each acquisition-sweep is a trial and each acquisition of a valid sample point in an empty time-bucket is a success.

In use of the binomial probability formula, one of two cases, the INDEPENDENT case and the DEPENDENT case, may obtain. In the INDEPENDENT case, the trials are independent, that is, the ocuurrence of an event in one trial does not affect the probability of an event in a subsequent trial. In the DEPENDENT case, however, the occurrence of an event in one trial does affect the probability of an event in a subsequent trial. This would be the case with repetitive sampling, particularly random repetitive sampling.

For the DEPENDENT case, formula (1) must be multiplied by a system constant which takes account of system dependencies:

$$P_r = \left[ \sum_{i=1}^{n} [p^i(n!/[i!(n-i)!])](1-p)^{(n-i)} \right] (K), \quad (2)$$

where "K" is the system constant. In the case of random repetitive sampling, "K" would be the number of points acquired per acquisition-sweep, that is, the time-range setting divided by the period of the sample clock. By the definition of binomial probabilities, (see *Probability With Applications*, Michael Woodroofe, McGraww- Hill, 1975, pp. 102–106) the term within the brackets of formula (2) sums to np. Then, by taking a Poisson approximation (see Woodroofe, pp. 92-94), the following substitution can be made:

$$(1-p)^{(n-i)} = (1-p)^{(1/p-1)}, \text{ approximately.} \quad (3)$$

So that finally for the DEPENDENT case:

$$P_r = Knp(1-p)^{(1/p-1)}. \quad (4)$$

Solving for "n", the minimum number of acquisition sweeps in the case of random-repetitive sampling, we have:

$$n = P_r/[Kp(1-p)^{1/p-1}]. \quad (5)$$

Formula (5) is the foundation of the present invention.

The present invention takes advantage of the foregoing analysis using variables and relationships which characterize digital oscilloscope operation. These are listed in TABLE 1.

TABLE 1

(a) RISETIME = .35/(bandwidth of the oscilloscope); (RISETIME = 1.25ns in examples below.);
(b) RANGE = user-selected time width of display screen 10;
(c) TIME_PER_DIVISION = RISETIME/2;
(d) MIN_PTS = RANGE/TIME_PER_DIVISION;
(e) DIV_FACTOR = 1/MIN_PTS = TIME_PER_DIVISION/RANGE;
(f) SAMPLE_CLOCK = period of sample clock; (SAMPLE_CLOCK = 40ns in examples below.);
(g) POINTS_PER_SWEEP = RANGE/SAMPLE_CLOCK;
(h) PROBABILITY = degree of certainty desired; (PROBABILITY = 99.7% for examples below.)
(i) MIN_SWEEPS = PROBABILITY/(POINTS_PER_SWEEP [(DIV_FACTOR)(1-DIV_FACTOR)(MIN_PTS-1)])

It can seen from Table 1 that RISETIME is defined as follows: RISETIME=0.35/(bandwidth of the oscilloscope). In the preferred embodiment of the present invention, the RISETIME is 1.165ns but for the sake of numerical examples, it is assumed herein that RISETIME=1.25ns. This RISETIME value is the limit of the precision of the oscilloscope, that is, it defines the highest frequency signal which the oscilloscpe may acquire. RANGE is the user-selected time-width of display screen 10. RANGE is also the sweep speed of an acqui­sition-sweep. Narrower RANGE settings have faster sweep speeds. In the preferred embodiment of the pres­ent invention the available RANGE selections are 10ns, 20ns, 50ns, 100ns, 200ns, 500ns, 1us, 2us, 5us, 10us, 20us, 50us and so on up to a maximum RANGE setting. This 1-2-5 sequence of RANGE settings follows industry convention. For an input signal with a frequency within the bandwidth of the oscilloscope, the RANGE setting will determine how much of the signal's waveform is visible on the display screen. For instance, at the 2us RANGE setting a full period of an input signal may be visible while at the 1us RANGE setting only half of a period of the same signal is visible. TIME_PER_DIVISION is simply one-half of the RISETIME, that is, TIME_PER_DIVISION=RISETIME/2. MIN_PTS is the RANGE divided by TIME_PER_DIVISION, that is, MIN_PTS=RAN­GE/TIME_PER_DIVISION. DIV_FACTOR is the reciprocal of MIN_PTS, that is, DIV_FACTOR=1­/MIN_PTS=TIME_PER_DIVISION/RANGE. SAMPLE-CLOCK is the period of the sample clock 50. It is a constant number. For the sake of numerical examples, it is assumed that SAMPLE_CLOCK=40ns. POINTS_PER_SWEEP is the RANGE setting divided by the period of the sample clock, that is, POINTS_PER_SWEEPS=RANGE/­SAMPLE_CLOCK. The POINTS_PER_SWEEP number is the number of sample points that may be collected in one acquisition-sweep when input signal 35 is sampled. At wide RANGE settings, many samples can be collected in a single acquisition-sweep. At the lowest RANGE setting, several acquisition-sweeps may be required to acquire a single sample point. For in­stance, at the 200ns RANGE setting, POINT­S_PER_SWEEP=RANGE/SAMPLE_­CLOCK=200ns/40ns=5, meaning that, on average, 5 samples points will be collected with each acquisition-sweep. On the other hand, at a RANGE setting of 10ns, POINTS_PER_SWEEP=RANGE/SAMPLE_­CLOCK=10ns/40ns=0.25, meaning that four acquisi­tion-sweeps will be required, on average, to acquire a single sample point in the 10ns RANGE. In the pre­ferred embodiment of the present invention, the time-width of each time-bucket will be less than or equal to one-half of the RISETIME of the instrument at known RANGE settings. At each of these RANGE settings it is therefore possible to acquire at least two samples points for every RISETIME unit of time, which is all that is necessary to meet the risetime specifications of the instrument. On the other hand, beginning at a cer­tain RANGE setting, it will no longer be possible to guarantee acquisition of two sample points for every RISETIME unit of time because the time-width of each time-bucket will be greater than RISETIME/2. In the examples given in this specification, the risetime crite­rion cannot be used at the RANGE of 1us and above because RANGE/NUMBER_OF_TIME_BUCK­ETS>RISETIME/2, that is, 1us/1000>0.625ns. At these RANGE settings the percentage filled criterion then applies. PROBABILITY is the desired percentage of certainty, expressed as a number between 0 and 1, that a given event will occur. MIN_SWEEPS is the minimum number of acquisition sweeps which must be performed to meet either the risetime or the percentage-filled criterion, depending upon the user-selected RANGE setting.

Given the variables above, the minimum number of acquisition-sweeps required when using either the rise­time or the percentage-filled criterion is defined from formula (5) above as:

$$\text{MIN\_SWEEPS} = \text{PROBABILTIY}/(\text{POINT­S\_PER\_SWEEP}[(\text{DIV\_FACTOR})(1­-\text{DIV\_FACTOR})^{(MIN-PTS-1)}]), \quad (6)$$

where $$n = \text{MIN\_SWEEPS}; \quad (7)$$

$$P_r = \text{PROBABILITY}; \quad (8)$$

$$\text{system constant } K = \text{POINTS\_PER\_SWEEP}; \quad (9)$$

$$p = \text{DIV\_FACTOR}; \quad (10)$$

$$1/p = \text{MIN\_PTS}. \quad (11)$$

Formula (6) applies to both the risetime and the pre­centagefilled criteria but there is a difference in the way MIN_PTS is defined in each case, as explained below in connection with Table 2 and Table 3. Since DIV_­FACTOR=1/MIN_PTS for both the risetime and the percentage-filled criteria, the MIN_PTS difference is crucial to the value of the MIN_SWEEPS number in each case.

Table 2 shows the values of the variables of Table 1 when using the risetime criterion definition of MIN_PTS for the time-ranges at which the risetime criteria is applicable, that is, when RANGE divided by the number of time-buckets is less than or equal to one-half of the risetime of the oscilloscope.

RANGE and only 400 time-buckets are physically realizable at the 20ns RANGE. In the preferred embodiment of the present invention, the 1000 time-buckets in waveform buffer 121 are addressed at these RANGE settings by multiplying the time-bucket addresses generated at the 10ns RANGE by 5 and those generated at the 20ns RANGE by 2.5.

As can be seen from a comparison of Tables 2 and 3, the risetime criterion method of calculating MIN_S-

TABLE 2

| RANGE | SAMPLE_CLOCK | POINTS_PER_SWEEP | MIN_PTS | DIV_FACTOR | MIN_SWEEPS = PROBABILITY/POINTS_PER_SWEEP[(DIV_FACTOR)(1 − DIV_FACTOR)$^{(MIN\_PTS-1)}$] |
|---|---|---|---|---|---|
| 10ns | 40ns | 0.25 | 16 | $\frac{1}{16} = .0625$ | $.997/(.25[(.0625)(1 - .0625)^{15}]) = 168$ |
| 20ns | 40ns | 0.50 | 32 | $\frac{1}{32} = .03125$ | $.997/(.5[(.03125)(1 - .0325)^{31}]) = 171$ |
| 50ns | 40ns | 1.25 | 80 | $\frac{1}{80} = .0125$ | $997/(1.25[(.0125)(1 - .0125)^{79}]) = 172$ |
| 100ns | 40ns | 2.50 | 160 | $\frac{1}{160} = .00625$ | $997/(2.5[(.00625)(1 - .00625)^{159}]) = 173$ |
| 200ns | 40ns | 5.00 | 320 | $\frac{1}{320} = .003125$ | $.997/(5[(.003125)(1 - .003125)^{319}]) = 173$ |
| 500ns | 40ns | 12.5 | 800 | $\frac{1}{800} = .00125$ | $.997/(12.5[(.00125)(1 - .00125)^{799}]) = 173$ |

Under these conditions, MIN_PTS equals RANGE divided by one-half-RISETIME. Thus, using a RISETIME of 1.25ns, at a range of 10ns, MIN_PTS equals 16; at a RANGE of 20ns, MIN_PTS equals 32; and so on until the critical RANGE at which the risetime criterion no longer applies, that is, 1us.

Table 3 shows the values of the variables of Table 1 when using the percentage-filled criterion definition of MIN_SWEEPS, that is, when MIN_SWEEPS equals the number of time-buckets times the percentage-filled criterion desired.

WEEPS generates a smaller MIN_SWEEPS number for the RANGE Settings 10ns through 500ns, the time-ranges for which RANGE/NUMBER_OF_TIME_BUCKETS is less than or equal to RISETIME/2. Hence, the risetime specification of the instrument can be met more quickly with fewer acquisition sweeps at these RANGE settings using the risetime criterion definition of MIN_SWEEPS.

Figure 6:
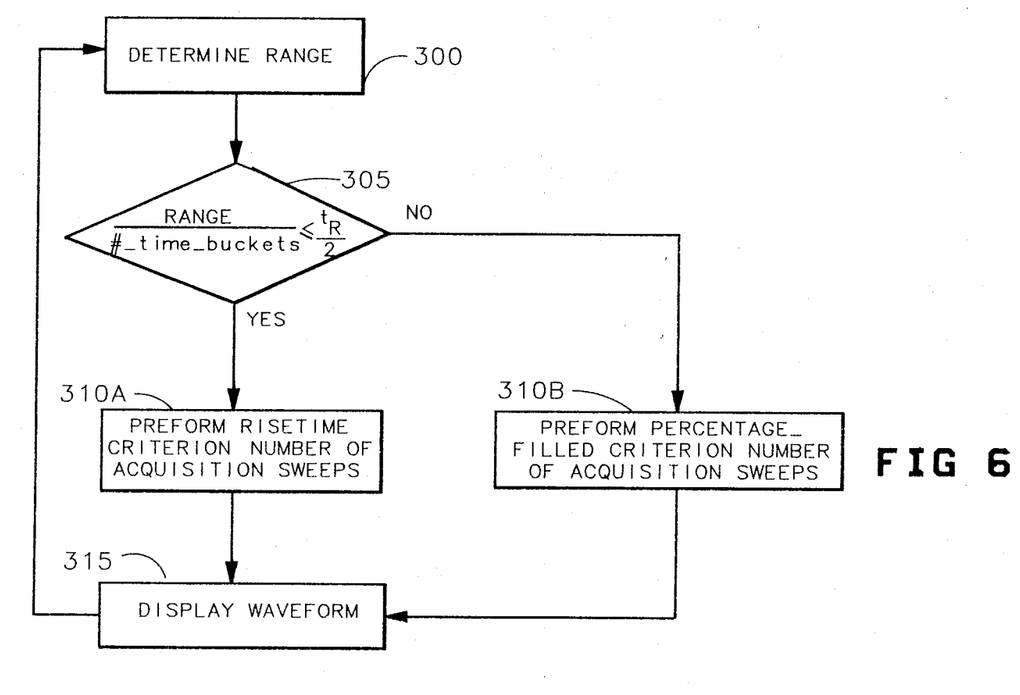
FIG. 6 is a macro-level flow chart showing the steps of the present invention.

FIG. 6 is a macro-level flowchart showing the steps of the present invention. The first step 300 is to determine the RANGE value. The RANGE value will be set

TABLE 3

| | RANGE | SAMPLE_CLOCK | POINTS_PER_SWEEP | 80%-100% MIN_PTS | 80%-100% DIV_FACTOR | 80%-100% of MIN_SWEEPS |
|---|---|---|---|---|---|---|
| Risetime Oriterion Applies | 10ns | 40ns | .25 | 160-200 | .00625-.005 | 1729-2176 |
| | 20ns | 40ns | .5 | 320-400 | .003125-.0025 | 1732-2165 |
| | 50ns | 40ns | 1.25 | 800-1000 | .00125-.001 | 1733-2167 |
| | 100ns | 40ns | 2.5 | 800-1000 | .00125-.001 | 867-1084 |
| | 200ns | 40ns | 5.0 | 800-1000 | .00125-.001 | 433-542 |
| | 500ns | 40ns | 12.5 | 800-1000 | .00125-.001 | 173-217 |
| Percentage-filled Oriterion Applies | 1 us | 40ns | 25 | 800-1000 | .00125-.001 | 87-108 |
| | 2 us | 40ns | 50 | 800-1000 | .00125-.001 | 43-54 |
| | 5 us | 40ns | 125 | 800-1000 | .00125-.001 | 17-22 |
| | 10 us | 40ns | 250 | 800-1000 | .00125-.001 | 9-11 |
| | 20 us | 40ns | 500 | 800-1000 | .00125-.001 | 4-5 |

In Table 3, numerical results for both an 80 percent and a 100 percent percentage-filled criterion are shown. Moreover, for the sake of comparison with Table 2, numerical results are shown for both the risetime criterion RANGE settings and the percentage-filled criterion RANGE settings. Note that MIN_PTS, as well as DIV_FACTOR, is a constant number over all but the two most narrow RANGE settings, 10ns and 20ns. This anomaly is a function of the resolution of FI 146, the 50 ps fine interpolator clock. Recall that the number of time-buckets in waveform buffer 121 is a constant, 1000, for every RANGE setting. However, at the 10ns and 20ns RANGE settings, RANGE/FI<1000, that is 10ns/50 ps=200 and 20ns/50 ps=400. Hence, only 200 time-buckets are physically realizable at the 10ns by the oscilloscope user. The next step 305 is to determine if the RANGE value divided by the number of time-buckets at that time-range is less than or equal to one-half of the risetime of the oscilloscope. If so then the risetime criterion MIN_SWEEPS number of acquisition sweeps for that RANGE is executed, as listed in Table 2. Otherwise, the percentage-filled MIN_SWEEPS number of acquisition-sweeps is executed, as listed in Table 3. (In the preferred embodiment of the present invention, the proper MIN_SWEEPS number is simply accessed from a memory array, indexed by RANGE settings.) Following execution of MIN_SWEEPS acquisition-sweeps for a given RANGE setting, the display routine is invoked and the waveform displayed. The steps are then repeated. Hence, the number of aquisition-sweep and display routine cycles is minimized while at the same time maximum precision is achieved whenever possible.

Figure 7:
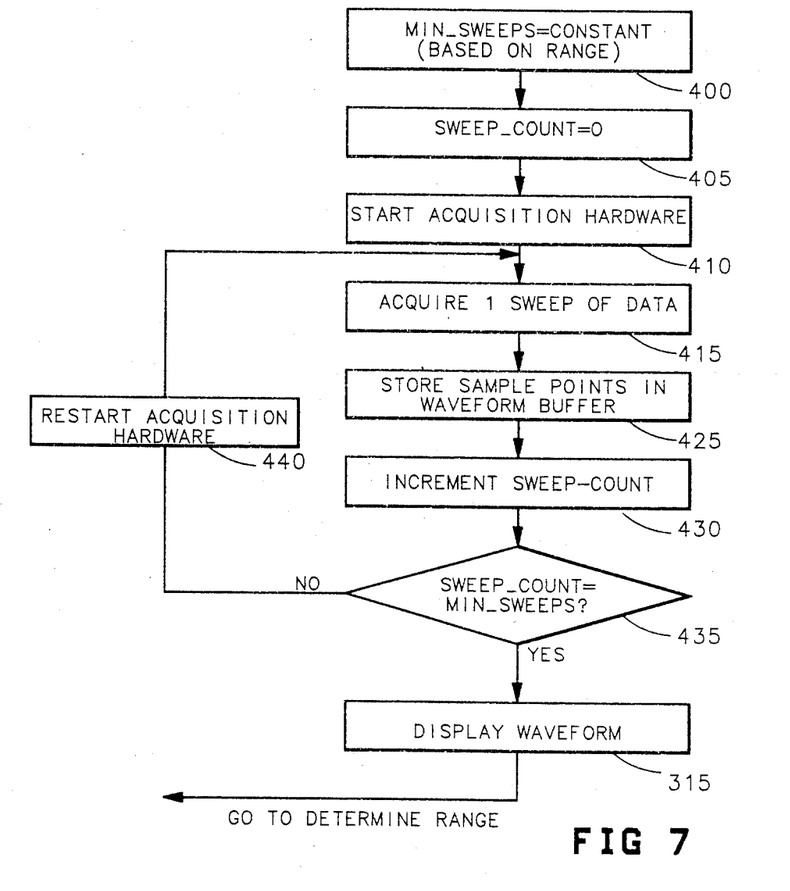
FIG. 7 is a micro-level flow chart showing the steps of the present invention.

FIG. 7 is a micro-level flowchart showing the steps of the present invention. The first step 400 is to determine the MIN_SWEEPS number based upon the RANGE setting. MIN_SWEEPS can be automatically found in a memory array having the appropriate MIN_SWEEPS number indexed by RANGE, similar in form to TABLES 2 and 3. The next step 405 is the initialization to zero of the counter variable SWEEP_COUNT. The next step 410 is the activation of sample acquisition hardware. The next step 415 is execution of an aquisition-sweep. The next step 425 is storage of the acquired sample points in waveform buffer 121. SWEEP_COUNT is incremented after each acquisition-sweep in step 430. Then another check is made in step 435 to determine if SWEEP_COUNT equals MIN_SWEEPS. If so, the waveform buffer is sent to display, otherwise another acquisition-sweep is executed pursuant to step 440.

I claim:

1. A method for determining and executing the minimum number of sample acquisition sweeps necessary to meet the risetime specification of a digital oscilloscope which uses randomrepetitive sampling, wherin said minimum number can be specified by the variable MIN_SWEEPS, comprising the steps of:
 (a) determining the range setting of the oscilloscope;
 (b) if the quotient of the range setting divided by the number of time-buckets is less than or equal to one-half of the risetime specification of the oscilloscope, iteratively performing steps (d) through (h) with the MIN_SWEEPS variable set by a risetime criterion;
 (c) if the quotient of the range setting divided by the number of time-buckets is greater than one-half of the risetime specification of the oscilloscope, iteratively performing the steps (d) through (h) with MIN_SWEEPS variable set by a percentage-filled criterion;
 (d) setting the MIN_SWEEPS variable to the value determined by the criterion of step (a) or step (b);
 (e) initializing a counter variable, which can be known as SWEEP_COUNT, to zero;
 (f) performing an acquisition sweep;
 (g) incrementing the counter variable, SWEEP_COUNT; and
 (h) repeating steps (f) through (g) until SWEEP_COUNT is equal to MIN_SWEEPS.

2. The method of claim 1, wherein the value of MIN_SWEEPS according to the risetime criterion and the value of MIN_SWEEPS according to the percentage-filled criterion is determined using a binomial probability formula.

3. The method of claim 2, wherein the binomial probability formula used to determine the MIN_SWEEPS number of acquisition sweeps to meet the risetime specification comprises the following relationship:

$$\text{MIN\_SWEEPS} = \text{PROBABILITY}/(\text{POINTS\_PER\_SWEEP}[(\text{DIV\_FACTOR})(1-\text{DIV\_FACTOR})^{(MIN\_PTS-1)}]).$$

* * * * *